US009022275B2

(12) United States Patent
Hsieh

(10) Patent No.: US 9,022,275 B2
(45) Date of Patent: May 5, 2015

(54) AUTOMATIC SOLDERING EQUIPMENT

(71) Applicant: Inventec Corporation, Taipei (TW)

(72) Inventor: Chin-Changmr Hsieh, Taipei (TW)

(73) Assignee: Inventec Corporation, Taipei (TW)

( * ) Notice: Subject to any disclaimer, the term of this patent is extended or adjusted under 35 U.S.C. 154(b) by 156 days.

(21) Appl. No.: 13/886,268

(22) Filed: May 2, 2013

(65) Prior Publication Data
US 2014/0209661 A1 Jul. 31, 2014

(30) Foreign Application Priority Data
Jan. 25, 2013 (TW) .............................. 102201767 U

(51) Int. Cl.
*B23K 3/06* (2006.01)
(52) U.S. Cl.
CPC ............. *B23K 3/0653* (2013.01); *B23K 3/0646* (2013.01)
(58) Field of Classification Search
USPC .................................................... 228/37, 260
See application file for complete search history.

(56) References Cited

U.S. PATENT DOCUMENTS

| 3,119,363 | A | * | 1/1964 | Ricben ............................ 228/37 |
| 4,447,001 | A | * | 5/1984 | Allen et al. ..................... 228/37 |
| 5,156,324 | A | * | 10/1992 | Hueste et al. ............. 228/180.1 |
| 5,368,222 | A | * | 11/1994 | Scorta ......................... 228/180.1 |
| 5,411,197 | A | * | 5/1995 | Nakamura et al. ............... 228/34 |
| 5,772,101 | A | * | 6/1998 | Nishimura et al. .............. 228/37 |
| 6,732,903 | B2 | * | 5/2004 | Wang et al. ....................... 228/37 |
| 8,091,758 | B2 | * | 1/2012 | Zen et al. .......................... 228/37 |
| 8,146,792 | B2 | * | 4/2012 | Yanaros et al. .................. 228/33 |
| 2008/0302861 | A1 | * | 12/2008 | Szymanowski et al. ...... 228/223 |
| 2010/0065610 | A1 | * | 3/2010 | Szymanowski ................. 228/37 |
| 2012/0006886 | A1 | * | 1/2012 | Sato et al. ...................... 228/260 |
| 2012/0024938 | A1 | * | 2/2012 | Yoshino et al. .................. 228/37 |

FOREIGN PATENT DOCUMENTS

| JP | 2005021965 | A | * | 1/2005 |
| JP | 2008043960 | A | * | 2/2008 |
| JP | 2011146638 | A | * | 7/2011 |
| KR | 2007010565 | A | * | 1/2007 |

* cited by examiner

*Primary Examiner* — Devang R Patel
(74) *Attorney, Agent, or Firm* — CKC & Partners Co., Ltd.

(57) ABSTRACT

Automatic welding equipment includes a wave soldering machine including a tank, a plurality of first nozzles, a first pump, and a first guide plate. The tank has an opening. The first nozzles and melted solder are disposed in the tank. The first pump is disposed in the tank for jetting the solder via the first nozzles. The first guide plate is located at the opening and includes a first plate portion and a second plate portion. The first plate portion is located over the first nozzles and has a plurality of first holes for passed through by the solder jetted from the first nozzles. The second plate portion, connected to the first plate portion, guides the solder to flow out of the first holes. The solder guided by the second plate portion passes through second holes of the second plate portion and returns into the tank.

6 Claims, 3 Drawing Sheets

AUTOMATIC SOLDERING EQUIPMENT

RELATED APPLICATIONS

This application claims priority to Taiwanese Application Serial Number 102201767, filed Jan. 25, 2013, which is herein incorporated by reference.

BACKGROUND

1. Field of Invention

The present application relates to automatic soldering equipment. More particularly, the present application relates to automatic soldering equipment including a wave soldering machine.

2. Description of Related Art

A surface mounting technology (SMT) is a soldering technology that has been widely used in recent years. Particular equipment is used by the SMT to accurately place a surface mounting component onto a printed circuit hoard pad which has been subjected to a print soldering paste or dispensing, and then a soldering process (for example, a wave soldering or reflow soldering) is made, such that a good mechanical and electrical connection is established between the component and the circuit board. However, a flow process of the current SMT process may be roughly divided into the following procedures: solder paste printing, solder paste printing detection, high speed element placement, all-purpose element placement, reflow soldering machine, optical detection and the like.

In a whole manufacturing process of the circuit board, the soldering process of the circuit board is one very important link, which is used for determining the advantages and disadvantages of the quality of one circuit board. Recently, the soldering process by which an electronic element with a pin is soldering to the circuit board is mostly completed through the wave soldering machine. Its process is simply described as: the pin of the electronic element is firstly coated with an appropriate soldering flux in advance and inserted into a corresponding through-hole of the circuit board. Afterwards, the circuit board passes through the wave soldering machine, and a face of the circuit board exposing the pin of the electronic element is made to contact with melted solder sufficiently, so as to make the electronic element and the circuit board combined together.

The above-mentioned wave soldering means that the melted soft tin solder (a tin lead alloy or a tin silver copper alloy) is jetted to form a solder wave required by a design through a power-driven pump or an electromagnetic pump, and the solder wave may also be formed by injecting nitrogen into a solder tank, such that the circuit board inserted with the electronic element in advance passes through the solder wave, so as to achieve the mechanical and electrical connection between the component and the circuit board. A wave soldering system may further be divided into many types according to the generated solder waves with different geometries.

Additionally, after the above-mentioned solder wave contacts with one side of the circuit board exposing the pin of the electronic element, the solder may return into the solder tank along a guide plate. However, even if the guide plate has been used in the current wave soldering machine to guide the solder to reflow, when the solder falls into the solder tank from an edge of the guide plate, a sputtering phenomenon may occur as before. When the solder is sputtered to a face of the circuit board inserted with the electronic element, it often causes a bad short circuit of the circuit board.

SUMMARY

Automatic soldering equipment which includes a wave soldering machine is provided. The wave soldering machine includes a tank, a plurality of first nozzles, a first pump, and a first guide plate. The tank has an opening and is used to accommodate melted solder. The first nozzles are disposed in the tank. The first pump is disposed in the tank for jetting the solder via the first nozzles. The first guide plate is located at the opening and includes a first plate portion and a second plate portion. The first plate portion is located over the first nozzles and has a plurality of first holes for passed through by the solder jetted from the first nozzles. The second plate portion, connected to the first plate portion and inclined toward the tank, is used to guide the solder flowing out of the first holes. The second plate portion has a plurality of second holes. The solder guided by the second plate portion passes through the second holes and returns into the tank.

In an embodiment of the present application, the above-mentioned wave soldering machine further includes a plurality of second nozzles, a second pump and a second guide plate. The second nozzles are disposed in the tank and are adjacent to the first nozzles. The second pump is disposed in the tank for jetting the solder via the second nozzles. The second guide plate is located at the opening and is adjacent to the first guide plate. The second guide plate is bent toward the tank along a direction facing the first guide plate for guiding the solder jetted by the second nozzles. The second guide plate has a plurality of third holes. The solder guided by the second guide plate passes through the third holes and returns into the tank.

In an embodiment of the present application, the above-mentioned first plate portion is located between the second plate portion and the second guide plate.

In an embodiment of the present application, the above-mentioned automatic soldering equipment further includes a conveying mechanism. The conveying mechanism includes two tracks. The two tracks stretch across the opening and form a first slant angle relative to a horizontal plane for conveying a circuit board over the opening along a conveying direction. The first guide plate and the second guide plate are fixed to the two tracks and are located between the tank and the two tracks.

In an embodiment of the present application, the above-mentioned first plate portion is paralleled to the two tracks. The second plate portion for ms a second slant angle relative to the horizontal plane, and the second slant angle is greater than the first slant angle.

In an embodiment of the present application, the above-mentioned first guide plate and the second guide plate are arranged sequentially along the conveying direction.

In an embodiment of the present application, the above-mentioned automatic soldering equipment further includes a coating module and at least one preheating module. The coating module is disposed below the two tracks for coating the soldering flux to the circuit board. The preheating module is disposed below the two tracks and is located between the coating module and the wave soldering machine for heating the circuit board coated with the soldering flux. The conveying mechanism is used to convey the circuit board to pass over the coating module, the preheating module, and the wave soldering machine sequentially.

In an embodiment of the present application, the above-mentioned wave soldering machine further includes at least one heater. The heater is disposed into the tank for heating the solder.

A primary technical feature of the automatic soldering equipment provided by the present application is that holes are uniformly drilled on the guide plate of the wave soldering machine for guiding the solder to reflow in a staggered manner. Therefore, before the solder flows from an edge of the guide plate to the tank, the solder may directly pass through the holes on the guide plate and fail into the solder tank, which not only may disperse and expand an area in which the solder returns into the tank, but also may slow down an impact strength effectively when the solder falls into the tank, so as to reduce a phenomenon of sputtering the solder and avoid the had short circuit problem of the circuit board.

DETAILED DESCRIPTION

Figure 1:
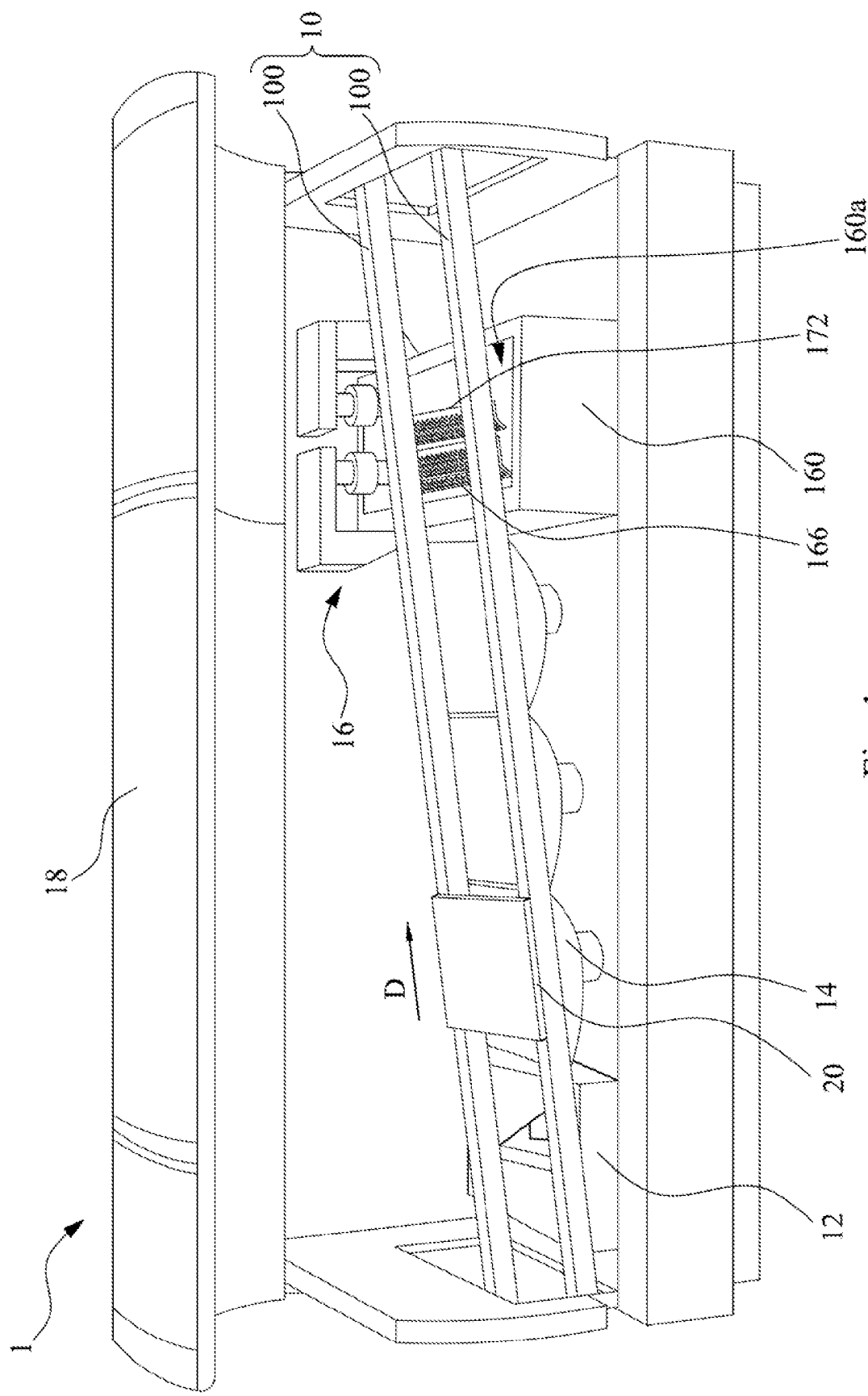
FIG. 1 is a perspective view depicting automatic soldering equipment of an embodiment of the present application.

A plurality of embodiments of the present application will be disclosed below with reference to drawings. For purpose of clear description, many details in practice will be described together with the following description. However, it should be understood that these details in practice are not used to limit the present application. That is to say, in some embodiments of the present application, these details in practice are unnecessary. Additionally, for purpose of simplifying drawings, some conventional structures and elements in the drawings will be shown in a simple and schematic way.

FIG. 1 is a perspective view depicting automatic soldering equipment 1 of an embodiment of the present application.

As shown in FIG. 1, in the embodiment, the automatic soldering equipment 1 includes a conveying mechanism 10, a coating module 12, a preheating module 14, a wave soldering machine 16 and a nitrogen cover glass plate 18. The conveying mechanism 10 of the automatic soldering equipment 1 includes two tracks 100. The two tracks 100 of the conveying mechanism 10 stretch across the whole automatic soldering equipment 1 and form a first slant angle α1 relative to the horizontal plane for conveying a circuit board 20 from a bottom left of the automatic soldering equipment 1 to a top right along a predetermined conveying direction D. The nitrogen cover glass plate 18 of the automatic soldering equipment 1 may be opened and closed. When the nitrogen cover glass plate 18 is closed, an operator may be isolated from the conveying mechanism 10, the coating module 12, the preheating module 14 and the wave soldering machine 16 in the automatic soldering equipment 1.

The coating module 12, the preheating module 14 and the wave soldering machine 16 of the automatic soldering equipment 1 are all disposed below the two tracks 100 of the conveying mechanism 10 and are arranged sequentially along the conveying direction a Therefore, the conveying mechanism 10 of the automatic soldering equipment 1 is used to convey the circuit hoard 20 to pass through over the coating module 12, the preheating module 14, and the wave soldering machine 16 sequentially.

The coating module 12 of the automatic soldering equipment 1 is used to coat the circuit board 20 with the soldering flux. When the two tracks 100 of the conveying mechanism 10 are used to convey the circuit board 20 over the coating module 12, the coating module 12 may be used to coat the circuit board 20 with the soldering flux thereon by utilizing methods of wave, foaming or jetting. The coating module 12 of the automatic soldering equipment 1 is primarily made up of an infrared sensor and a nozzle (not shown). Therefore, the infrared sensor may be utilized to sense whether the circuit board 20 has entered and measure a length of the circuit board 20. Many electronic elements (not shown) are inserted onto the circuit board 20. The soldering flux is used to form a protective film on a soldering face (that is, a face of the circuit board 20 exposing the pin of the electronic element) of the circuit board 20.

Since when soldering the soldering flux must reach and keep one activation temperature to ensure a complete soaking of a soldering spot, the preheating module 14 of the automatic soldering equipment 1 is disposed between the coating module 12 and the wave soldering machine 16 for heating the circuit board 20 coated with the soldering flux. A preheating action after the soldering flux is coated may gradually enhance the temperature of the circuit board 20 to make the soldering flux activated, so as to form a good soldering spot. A preheating process of the preheating module 14 may be used to reduce a thermal impact encountered when the electronic element on the circuit board 20 enters the wave soldering machine 16 subsequently. In addition to this, this preheating process further may be used to evaporate all the moisture or the carrier solvent for diluting the soldering flux that may be absorbed. If the moisture or the carrier solvent for diluting the soldering flux is not removed, they may boil and make solder 3 (referring to FIG. 3) sputtered onto the nitrogen cover glass plate 18 or generate a steam leaving in the solder 3 to form a hollow soldering spot or sand hole when the circuit board 20 passes through the wave soldering machine 16.

The preheating module 14 of the automatic soldering equipment 1 performs the preheating by employing a thermal radiation manner, while a preheating method may employ a forced hot air convection, an electric heat convection, an electric bar heating, an infrared heating and the like. However, the present application is not limited in this regard.

Additionally, a number and a region length of the preheating module 14 of the automatic soldering equipment 1 are determined by a yield and a conveying speed of the conveying mechanism 10. When the yield of the automatic soldering equipment 1 is higher, in order to make the circuit board 20 reach a required soaking temperature, a longer region of the preheating module 14 is needed. Additionally, since the thermal capacity of a double-faced circuit hoard and a multilayer circuit board is larger, they need a higher preheating temperature than a single-faced circuit board.

Figure 2:
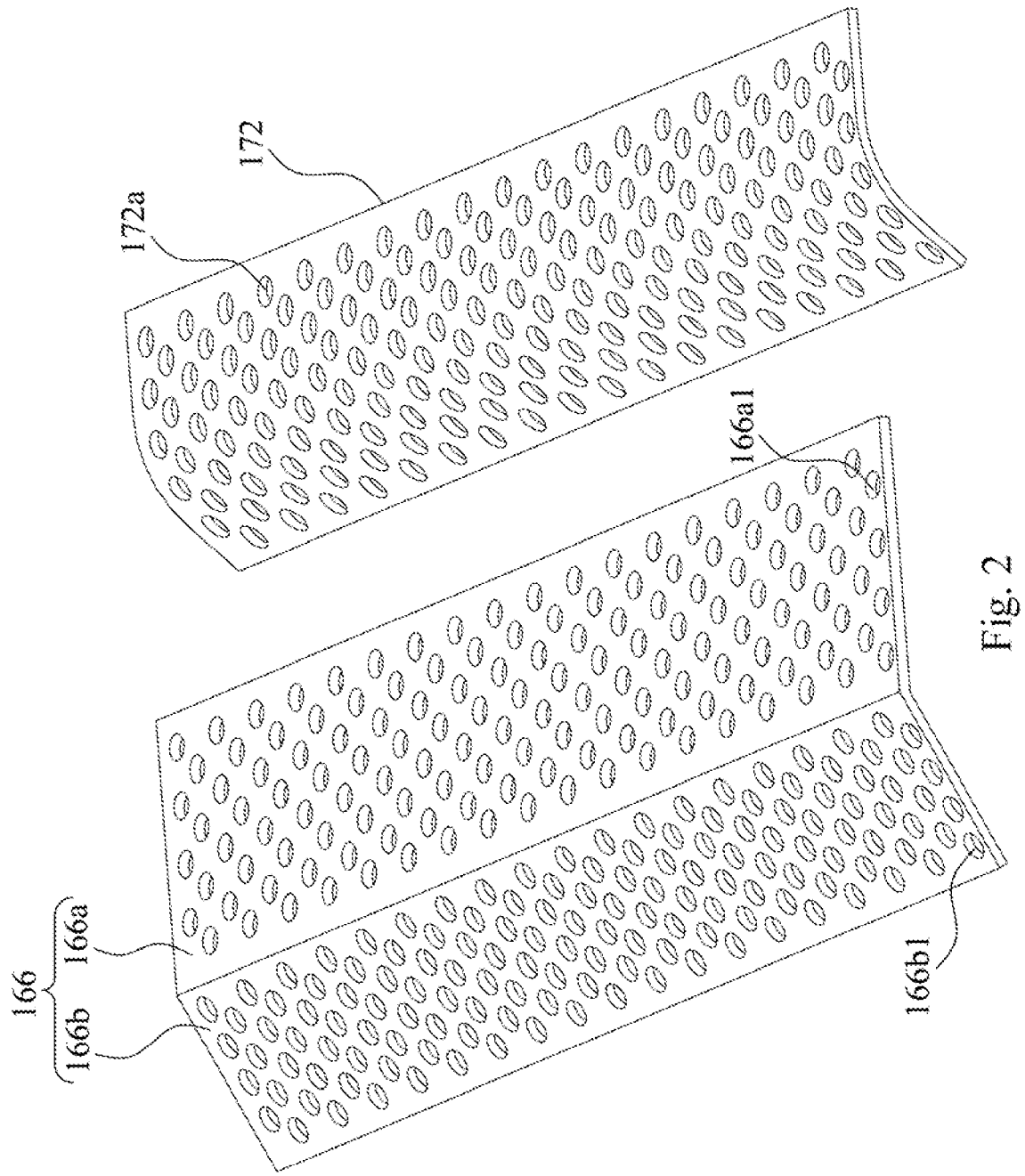
FIG. 2 is a perspective view depicting the first guide plate and the second guide plate of the wave soldering machine in FIG. 1.
Figure 3:
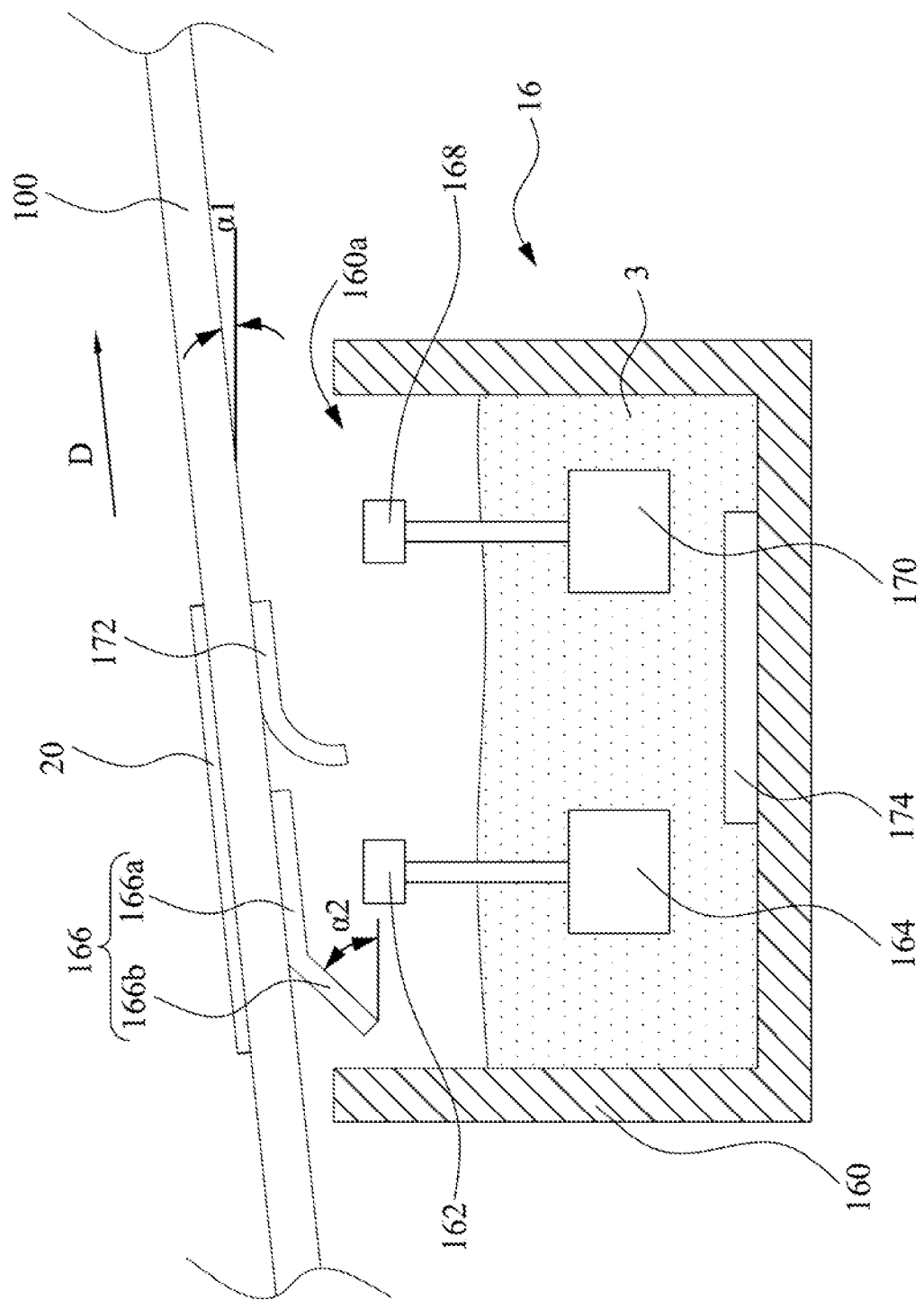
FIG. 3 is a partial sectional view depicting the wave soldering machine and the conveying mechanism in FIG. 1.

FIG. 2 is a perspective view depicting a first guide plate 166 and a second guide plate 172 of the wave soldering machine 16 in FIG. 1. FIG. 3 is a partial sectional view depicting the wave soldering machine 16 and the conveying mechanism 10 in FIG. 1.

As shown in FIGS. 2 and 3, in the embodiment, the wave soldering machine 16 of the automatic soldering equipment 1 includes a tank 160, a plurality of first nozzles 162, a first pump 164, the first guide plate 166 and a heater 174. The tank 160 of the wave soldering machine 16 has an opening 160a and is used to accommodate the melted solder 3. The two tracks 100 of the conveying mechanism 10 stretch across the opening 160a of the tank 160. The heater 174 of the wave soldering machine 16 is disposed in the tank 160 for heating the solder 3 and maintaining the solder 3 in a melted state.

The first nozzles 162 of the wave soldering machine 16 are disposed in the tank 160 toward the opening 160a of the tank 160. The first pump 164 of the wave soldering machine 16 is disposed in the tank 160 for jetting the solder 3 accommodated in the tank 160 via the first nozzles 162. The first guide plate 166 of the wave soldering machine 16 is located at the opening 160a of the tank 160 and includes a first plate portion 166a and a second plate portion 166b.

The first guide plate 166 of the wave soldering machine 16 is fixed to the two tracks 100 of the conveying mechanism 10 and is located between the tank 160 and the two tracks 100. Further, the first plate portion 166a of the first guide plate 166 is located over the first nozzles 162 and has a plurality of first holes 166a1. After the solder 3 is jetted via the first nozzles 162 by the first pump 164 of the wave soldering machine 16, the solder 3 jetted from the first nozzles 162 may pass through the first holes 166a1 of the first plate portion 166a and flow out of the first holes 166a1 to become a first solder wave with a stronger impact force. Therefore, when the two tracks 100 of the conveying mechanism 10 convey the preheated circuit board 20 over the opening 160a of the tank 160 along the conveying direction D, the first solder wave flowing out of the first holes 166a1 of the first plate portion 166a will contact with the soldering face of the circuit board 20.

As shown in FIG. 3, in an embodiment, the two tracks 100 of the conveying mechanism 10 form the first slant angle α1 relative to the horizontal plane, and the first slant angle α1 is 5 degrees to 8 degrees, but the present application is not limited in this regard. Therefore, after flowing out of the first holes 166a1 the direction of the solder 3 flowing on the first plate portion 166a may be opposite to a travelling direction (that is, the conveying direction D) of the circuit board 20.

It should be noted that, herein, the first solder wave formed by flowing out of the first holes 166a1 is a disturbance wave. The disturbance wave has a higher vertical pressure under a disturbance, which can make the solder 3 well penetrated between the pin of the electronic element and the pad (not shown) on the circuit board 20, so as to complete a soldering spot formation.

Additionally, the second plate portion 166b of the first guide plate 166 is connected to the first plate portion 166a and is inclined toward the tank 160. In other words, an edge of a side of the second plate portion 166b far away from the first plate portion 166a is closer to the solder 3 in the tank 160. Further, the first plate portion 166a of the first guide plate 166 is paralleled to the two tracks 100 of the conveying mechanism 10. The second plate portion 166b of the first guide plate 166 forms a second slant angle α2 relative to the horizontal plane, and the second slant angle α2 is greater than the first slant angle α1. In an embodiment, the second slant angle α2 is 55 degrees to 58 degrees, however, the present application is not limited in this regard.

Therefore, the function of the second plate portion 166b is used to guide the solder 3 flowing out of the first holes 166a1, such that the solder 3 returns into the tank 160. The second plate portion 166b of the first guide plate 166 has a plurality of second holes 166b1. The second holes 166b1 are uniformly drilled onto the second plate portion 166b in the staggered manner. Before a part of the solder 3 flowing along the second plate portion 166b flows to the edge of the side of the second plate portion 166b far away from the first plate portion 166a and then returns into the tank 160, the part of the solder 3 may directly pass through the second holes 166b1 on the second plate portion 166b and fall into the tank 160. In such a way, the second plate portion 166b of the first guide plate 166 may disperse and expand the area in which the solder 3 returns into the tank 160 by the second holes 166b1 and slow down the impact strength effectively when the solder 3 falls into the tank 160, so as to reduce the phenomenon of sputtering the solder 3. Therefore, a face of the circuit board 20 inserted with the electronic element may avoid the bad short circuit problem due to the sputtering of the solder 3.

As also shown in FIGS. 2 and 3, in the embodiment, the wave soldering machine 16 of the automatic soldering equipment 1 further includes a plurality of second nozzles 168, a second pump 170 and a second guide plate 172. The second nozzles 168 of the wave soldering machine 16 are disposed in the tank 160 and are adjacent to the first nozzles 162 toward the opening 160a of the tank 160. The second pump 170 of the wave soldering machine 16 is disposed in the tank 160 for jetting the solder 3 accommodated in the tank 160 via the second nozzles 168. The second guide plate 172 of the wave soldering machine 16 is fixed to the two tracks 100 of the conveying mechanism 10 and is located between the tank 160 and the two tracks 100. Further, the second guide plate 172 of the wave soldering machine 16 is located at the opening 160a of the tank 160 and is adjacent to the first guide plate 166.

After the solder 3 is jetted from the second nozzles 168 by the second pump 170 of the wave soldering machine 16, the solder 3 jetted from the second nozzles 168 may form a more gentle second solder wave between the opening 160a of the tank 160 and the second guide plate 172. Therefore, when the two tracks 100 of the conveying mechanism 10 continue to convey the circuit board 20 that has passed through the first solder wave over the second guide plate 172 along the conveying direction D, the second solder wave flowing out between the opening 160a of the tank 160 and the second guide plate 172 will contact with the soldering face of the circuit board 20.

It should be noted that, herein, the second solder wave flowing out between the opening 160a of the tank 160 and the second guide plate 172 may generate an eddy around the pin of the electronic element. The solder 3 continuing to contact with the circuit board 20 may perform a scrubbing-like action for the circuit board 20, such that all the soldering flux and oxide film residuals on the circuit board 20 are removed and a soaking is formed when the soldering spot reaches the soaking temperature.

The first guide plate 166 and the second guide plate 172 of the wave soldering machine 16 are arranged sequentially along the conveying direction D, and the second guide plate 172 is bent toward the tank 160 along the direction facing the first guide plate 166 that is, the direction opposite to the conveying direction D). In other words, an edge of a side of the second guide plate 172 adjacent to the first guide plate 166 is closer to the solder 3 in the tank 160. Therefore, the function of the second guide plate 172 is used to guide the solder 3 jetted from the second nozzles 168, such that the solder 3 returns into the tank 160. The second guide plate 172 has a plurality of third holes 172a. The third holes 172a are uniformly drilled onto the second guide plate 172 in the staggered manner. Before a part of the solder 3 flowing along the second guide plate 172 flows to the edge of the side of the second guide plate 172 adjacent to the first guide plate 166 and then returns into the tank 160, the part of the solder 3 may directly pass through the third holes 172a on the second guide plate 172 and fall into the tank 160. In such a way, the second guide plate 172 may disperse and expand the area in which the solder 3 returns into the tank 160 by the third holes 172a and may slow down the impact strength effectively as well when the solder 3 falls into the tank 160 and reduce the phenomenon of sputtering the solder 3.

It may be apparent from the above detailed description of specific embodiments of the present application that, a primary technical feature of the automatic soldering equipment provided by the present application is that the holes are uniformly drilled on the guide plate of the wave soldering machine for guiding the solder to reflow in the staggered manner. Therefore, before the solder flows from the edge of the guide plate to the tank, the solder may directly pass through the holes on the guide plate and fall into the solder tank, which not only may disperse and expand the area in which the solder returns into the tank, but also may slow down the impact strength effectively when the solder falls into the tank, so as to reduce the phenomenon of sputtering the solder and avoid the bad short circuit problem of the circuit board.

Although the present application has been disclosed with reference to the above embodiments, these embodiments are not intended to limit the present application. It will be apparent to those of skills in the art that various modifications and variations can be made without departing from the spirit and scope of the present application. Therefore, the scope of the present application should be defined by the appended claims.

What is claimed is:

1. Automatic soldering equipment comprising:
   a wave soldering machine comprising:
   a tank having an opening and used to accommodate melted solder;
   a first nozzle disposed in the tank;
   a first pump, disposed in the tank, for jetting the solder via the first nozzle;
   a first guide plate located at the opening and comprising:
      a first plate portion, located over the first nozzle, and having a plurality of first holes, for passed through by the solder jetted from the first nozzle; and
      a second plate portion, connected to the first plate portion and inclined toward the tank, for guiding the solder to flow out of the first holes, the second plate portion having a plurality of second holes, and the solder guided by the second plate portion passing through the second holes and returning into the tank;
   a second nozzle disposed in the tank and adjacent to the first nozzle;
   a second pump disposed in the tank for jetting the solder via the second nozzle; and
   a second guide plate located at the opening and adjacent to the first guide plate, wherein the second guide plate is bent toward the tank along a direction facing the first guide plate for guiding the solder jetted from the second nozzle, the second guide plate has a plurality of third holes, and the solder guided by the second guide plate passes through the third holes and returns into the tank; and
   a conveying mechanism, wherein the conveying mechanism comprises two tracks, and the tracks stretch across the opening and form a first slant angle relative to a horizontal plane for conveying a circuit board over the opening along a conveying direction, and the first guide plate and the second guide plate are fixed to the tracks and located between the tank and the tracks.

2. The automatic soldering equipment of claim 1, wherein the first plate portion is located between the second plate portion and the second guide plate.

3. The automatic soldering equipment of claim 1, wherein the first plate portion is paralleled to the tracks, the second plate portion thrills a second slant angle relative to the horizontal plane, and the second slant angle is greater than the first slant angle.

4. The automatic soldering equipment of claim 1, wherein the first guide plate and the second guide plate are arranged sequentially along the conveying direction.

5. The automatic soldering equipment of claim 1, further comprising:
   a coating module, disposed below the tracks, for coating the circuit board with a soldering flux; and
   at least one preheating module, disposed below the tracks and located between the coating module and the wave soldering machine, for heating the circuit board coated with the soldering flux,
   wherein the conveying mechanism is used to convey the circuit board to pass over the coating module, the preheating module, and the wave soldering machine sequentially.

6. The automatic soldering equipment of claim 1, wherein the wave soldering machine further comprises at least one heater which is disposed in the tank for heating the solder.

* * * * *